United States Patent
Mikhael et al.

(10) Patent No.: US 6,649,433 B2
(45) Date of Patent: Nov. 18, 2003

(54) SELF-HEALING FLEXIBLE PHOTONIC COMPOSITES FOR LIGHT SOURCES

(75) Inventors: Michael G. Mikhael, Tucson, AZ (US); Angelo Yializis, Tucson, AZ (US)

(73) Assignee: Sigma Technologies International, Inc., Tucson, AZ (US)

( * ) Notice: Subject to any disclaimer, the term of this patent is extended or adjusted under 35 U.S.C. 154(b) by 75 days.

(21) Appl. No.: 09/892,120

(22) Filed: Jun. 26, 2001

(65) Prior Publication Data

US 2003/0080677 A1 May 1, 2003

(51) Int. Cl.$^7$ .............................. H01L 21/00; H01J 1/62
(52) U.S. Cl. ........................... 438/22; 438/82; 438/99; 438/24; 438/28; 438/46; 438/47; 257/79; 257/82; 257/40; 313/504; 313/506; 428/690; 428/411.1; 428/76
(58) Field of Search .............................. 438/22, 82, 99, 438/24, 28, 46, 47; 257/79, 82, 40; 427/496, 255.2; 428/690, 411.1, 76; 528/422; 136/263; 313/504, 506

(56) References Cited

U.S. PATENT DOCUMENTS

| 5,739,545 | A | * | 4/1998 | Guha et al. ................... 257/40 |
| 5,900,327 | A | * | 5/1999 | Pei et al. ...................... 428/690 |
| 5,902,641 | A | | 5/1999 | Affiito et al. ............. 427/255.2 |
| 6,040,017 | A | | 3/2000 | Mikhael et al. ............. 427/496 |
| 6,331,356 | B1 | * | 12/2001 | Angelopoulos et al. ... 428/411.1 |
| 6,476,184 | B1 | * | 11/2002 | Janietz et al. ................ 528/422 |
| 2002/0140347 | A1 | * | 10/2002 | Weaver ....................... 313/506 |

* cited by examiner

Primary Examiner—Matthew Smith
Assistant Examiner—B. V. Keshavan
(74) Attorney, Agent, or Firm—Antonio R. Durando; Durando Birdwell & Janke, PLC

(57) ABSTRACT

A heterogeneous blend of small electron-donor organic molecules and polymerizable monomers is flash evaporated to provide a molecular-level vapor-phase mixture, which is then condensed and cured in-line as a homogeneous liquid layer on a flexible web containing an anodic layer. The procedure is repeated with an electron-acceptor organic substance, which is deposited over the electron-donor layer. A metallic cathode is then deposited over the electron-acceptor layer and the composite OLED product is packaged. The electrical characteristics and the thickness of the metallic cathode and the composition of the polymer layers are selected such as to produce the gasification of elemental carbon generated by dielectric breakdowns and the oxidation of any exposed cathodic surface, thereby providing a built-in mechanism to prevent the propagation of the damage caused by electrical shorts.

53 Claims, 3 Drawing Sheets

SELF-HEALING FLEXIBLE PHOTONIC COMPOSITES FOR LIGHT SOURCES

BACKGROUND OF THE INVENTION

1. Field of the Invention

This invention is related in general to processes for the manufacture of photonic polymer composite films. In particular, the invention pertains to large-area flexible photonic films with self-healing properties produced by flash evaporation, vacuum deposition and radiation curing.

2. Description of the Related Art

Organic light-emitting diodes (OLEDs) consist of the combination of a hole-transport (electron-donor) organic material with an electron-transport (electron-acceptor) compound such as an organometallic substance. Both materials may be in the form of monomers, oligomers or polymers combined in a single layer or in multi-layer composite structures sandwiched between two electrodes. The composites are typically deposited on a carrying substrate either by a solvent-based technique or a vapor-deposition process. For example, U.S. Pat. Nos. 5,902,641 and 6,040,017 describe flash-evaporation techniques for the deposition of single- and multi-layer structures, respectively.

Manufacturing defects in the active layers of OLEDs, such as may be caused by embedded foreign particles, micro-inclusions, or micro-protrusions, can produce electro-mechanically and dielectrically weak spots that in turn can lead to localized structural breakdowns. These pinhole occurrences typically result in a high localized current flow, or even in the formation of an arc, between the anode and the cathode electrodes of the OLED. When this kind of dielectric breakdown occurs, the capacitive energy stored between the two electrodes is first discharged, and then it is followed by a continuous current flow supplied by the power source energizing the OLED. This type of breakdown and the attendant high currents cause the formation of elemental carbon that further enhances the electrical conductivity between the electrodes in the vicinity of the damaged spot, thereby producing more current and in turn the formation of more conductive carbon. Thus, the damage propagates and, if not controlled, it leads to complete failure and functional destruction of the OLED device. This is a major drawback in the utilization of currently available OLED technology for many potential applications in which it could otherwise be advantageously adopted.

Another problem with present organic photonic systems lies in the rigidity and brittleness of their structure. All small organic molecules used to produce hole-transport layers (HTL) and electron-transport layers (ETL) consist of crystals that form very brittle thin films. Thus, while these materials may be appropriate for small-area glass-supported devices, less brittle and tougher thin films are required for large-area flexible light sources. Accordingly, the possibility of improving the mechanical properties of photonic films by including such active small molecules inside a polymer matrix has been investigated. Because of the poor solubility of photonic molecules in polymeric materials and the tendency of these molecules to separate out of the polymeric matrix, this line of research has not produced satisfactory results.

Therefore, there is still a need for an organic photonic structure that is both self-healing from pin-hole dielectric failures and sufficiently flexible to warrant the manufacture of large-area OLED devices. This invention is directed at a novel process for achieving these objectives through flash evaporation, vapor deposition, and curing of the various constituents under parameters selected to yield a flexible, self-healing, composite photonic layer.

BRIEF SUMMARY OF THE INVENTION

The primary objective of this invention is an organic LED structure that prevents the propagation of the damage caused by the occurrence of an electrical short between the electrodes of the device.

Another important objective is a sufficiently flexible photonic structure to permit large-area applications over flexible substrates.

Another goal is an advantageous method of manufacture for photonic composites that have such self-healing and flexible-structure characteristics.

Yet another goal is a production process suitable for making large-area photonic products by direct deposition of the photonic layer or layers over a flexible substrate.

Another objective is a process that can be implemented at high production rates.

Still another goal is a process that produces a highly homogeneous, defect-free, film.

Specifically, a goal of the invention is a process particularly suitable for manufacturing large light sources for buildings, such as for wall, ceiling, and window signs.

Another specific goal is a process particularly suitable for manufacturing thin-film lights for the automotive industry.

Yet another specific goal is a process suitable for manufacturing flexible photonic composites for general decorative applications.

A final objective is a method of manufacture that can be implemented relatively easily and economically utilizing modified prior-art vapor deposition technology.

Therefore, according to these and other objectives, one aspect of the invention consists of flash evaporating a heterogeneous blend of small photonic organic molecules and a binder consisting of polymerizable monomers or oligomers to provide a vapor-phase mixture at the molecular level. The mixture is then condensed as a homogeneous liquid layer on a substrate and cured in-line within a very short time (in the order of milliseconds) to ensure that phase separation of the homogeneous condensed film does not occur. According to another aspect of the invention, the surface resistance of the metallic cathode and the chemical characteristics of the polymer binder in the photonic structure are selected such as to ensure the melting and oxidation of exposed portions of the cathode and the complete combustion of elemental carbon generated during a dielectric breakdown in the device, thereby providing a built-in mechanism for minimizing conductivity and preventing the propagation of the damage caused by electrical shorts. The resulting characteristics of self-healing and flexibility of the OLED structure are advantageously utilized to produce large-area flexible light sources for automotive, sign, and decorative applications.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose but one of the various ways in which the invention may be practiced.

DESCRIPTION OF THE PREFERRED EMBODIMENTS OF THE INVENTION

This invention is based on the idea of manipulating the physical characteristics of the electrodes and the chemical structure of organic light-emitting diodes to produce an insulating barrier and a fuel-deficient environment at the sites of electrical shorts caused by dielectric breakdowns. This is accomplished by judiciously selecting the electrode material and thickness and the binder's composition in the layered structure of the photonic composite. Moreover, the invention is preferably carried out with flash-evaporation processes because of their versatility of operation, which also makes it possible to produce large-area OLEDs on flexible substrates. It should be recognized, however, that other methods of deposition may also be suitable for achieving the same self-healing and structural-flexibility objectives As used herein, the term oligomer is intended to refer not only to molecular chains normally designated as such in the art (typically containing between two and ten monomer molecules), but also to low-molecular weight polymers; specifically, oligomer is meant to encompass any polymerized molecule having a molecular weight sufficiently low to permit its vaporization under vacuum at a temperature lower than its temperature of thermal decomposition. With current vacuum technology, such maximum molecular weight is approximately 5,000, the precise molecular weight depending on the specific monomer used, but it is understood that greater molecular weights would become available for inclusion in the practice of the invention if greater vacuum conditions were obtained. The term monomer alone is used often for convenience throughout the description of the invention, but it is intended to include oligomers as well, as oligomers are defined above.

Figure 1:
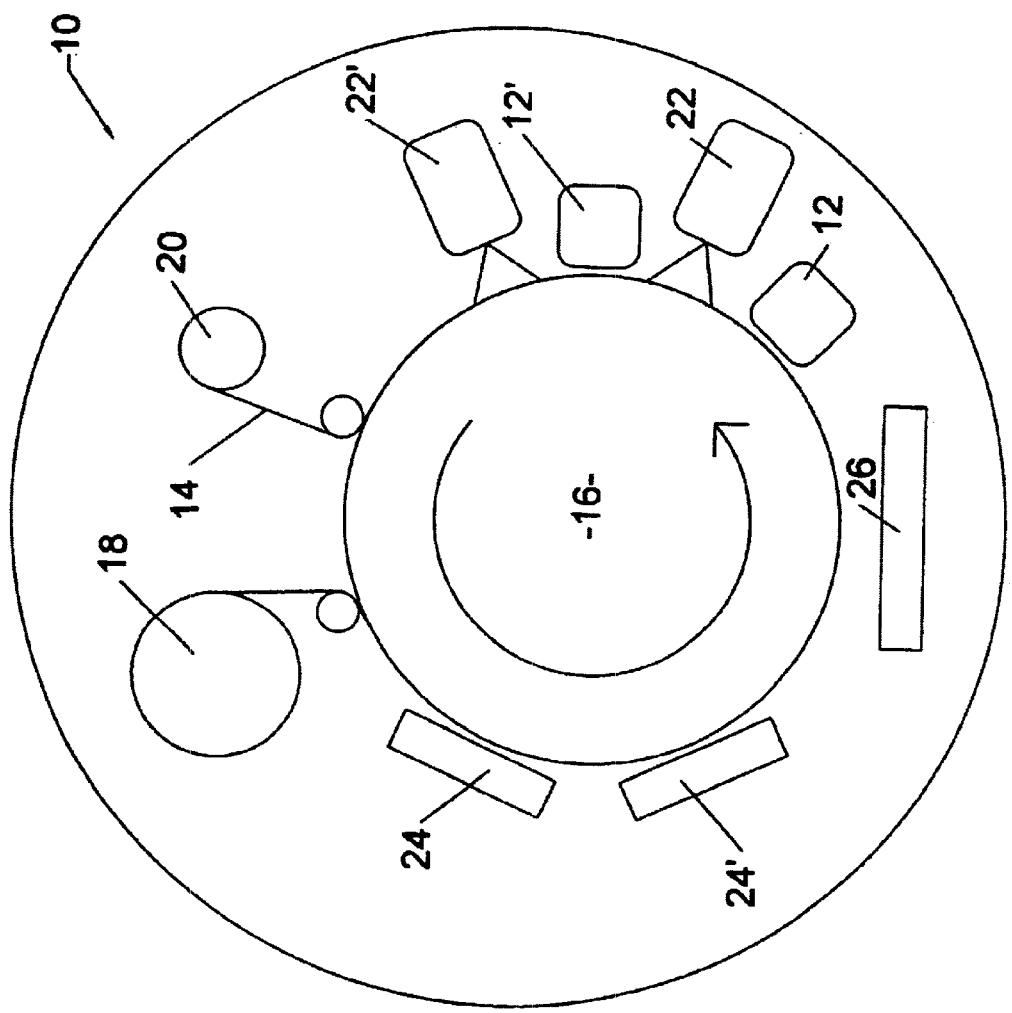
FIG. 1 is a schematic representation of conventional vacuum vapor deposition and radiation curing units in a vacuum chamber used to practice the invention.

For clarity of illustration, the invention is described with reference to conventional flash-evaporation apparatus 10, as illustrated schematically in FIG. 1. In general, a liquid monomer from a supply reservoir (not shown) is fed through a capillary tube and an atomizer 12 into the heated evaporator section of a vacuum deposition chamber 10, where the monomer is flash vaporized under vacuum. Similarly, a solid monomer may be used in equivalent fashion by feeding it through a heated extruder and a nozzle for flash evaporation, as described in U.S. Ser. No. 09/346,877, hereby incorporated by reference. The resulting monomer vapor is passed into a condensation section of the unit, where it condenses and forms a thin liquid film upon contact with the cold surface of an appropriate substrate, such as a web or film 14, which in turn is contacted by a cold rotating drum 16 as it progresses from a feed roll 18 to a take-up roll 20. The deposited liquid film is then cured by exposure to an electron-beam or ultraviolet radiation source 22. A duplicate polymer coating system with a corresponding liquid (or solid) monomer supply reservoir, capillary tube, atomizer 12', and radiation source 22' may be utilized in series to apply two monomer coatings over the film substrate 14 in a single pass. Additional coating units could be employed serially to manufacture multiple-layer composites. Accordingly, dual sputtering units 24,24' may be employed in separate passes to deposit ceramics barriers and other metal-oxide layers for various purposes. Since the ultimate objective is the formation of solid films, the initial liquid monomers must be capable of polymerization and contain enough reactive groups to ensure that a sufficiently large polymeric molecule results and yields a solid product. A metal vaporization unit 26 may also be used to deposit a thin metal layer, such as an electrode film, for in-line multi-layer deposition over the web 14. A conventional plasma-gas treating system (not shown) may also be used to clean and prepare the web or film 14 prior to deposition, if desired.

As is now recognized in the art, the flash vaporization of a solid/liquid blend produces a perfectly homogeneous mixture first in the vapor state and subsequently in the cured and crosslinked state, regardless of the homogeneous or heterogeneous condition of the original blend. Therefore, this property of vapor deposition has been exploited to yield single or multi-layered composites of photonic material from electron-rich and electron-poor molecules blended with polymerizable monomers. (See for example, the layered structures disclosed in U.S. Pat. No. 6,040,017.) As illustrated in cross-section in FIG. 2, as in the case of a typical multi-layer OLED, a device 40 according to the invention includes an anodic layer 42 (such as indium tin oxide material, ITO) deposited over a transparent barrier 44 adhered to a supporting substrate 46 (such as a PET film). A composite matrix 48 of organic electron-donor molecules embedded in a polymer is deposited over the anode 42, followed by another composite matrix 50 of organic electron-acceptor molecules incorporated into the same or another polymeric material. A cathodic layer 52 is then deposited over the layer 50 and, finally, the entire structure is packaged into a high-barrier protective layer 54 (which typically includes multiple layers). An insulated polymer layer 56 may also be provided, as well as a thick-film cathode contact 58 (and a corresponding anode contact, not shown) for current collection and electrical connection.

According to the invention, the device 40 can be advantageously constructed in widths of 1–4 feet and lengths of 1–10 feet. Structural flexibility and larger OLED sizes than previously achieved are obtained by successive vapor depositions of the various layers constituting the photonic composites, including the packaging layers, over a flexible, continuous web. For example, an anodic layer 42 of ITO may first be deposited over a flexible substrate or web 18 in a continuous process that can yield as many as hundreds of square feet of product in a single run. Preferred substrates 46 may consist of a polyethylene terphthlate (PET) or a polyethylene naphthalenedicarboxylate (PEN) base film. The layer 48 consists of electron-donor molecules, such as N,N'-Bis(3-methylphenyl)-N,N'-diphenylbenzidine (TPD) blended with an acrylate monomer or oligomer binder, flash evaporated, condensed and rapidly cured over the anode 42. Alternative donor molecules to TPD may consist of polyanaline, polypyrrol, polythiophene, or any aromatic tertiary amines functionalized with vinyl, epoxy or acrylate groups for subsequent curing or cross-linking. Alternative binders may be functional vinyl-carbazole or bicycloalyphatic epoxy monomers, or heat-sealing or pressure-sensitive adhesive oligomers.

The preferred electron-transport layer 50 consists of a blend of electron-acceptor molecules, such as aluminum quinolinolate (Alq), blended with an acrylate monomer or oligomer binder. The blend (liquid or solid) is flash evaporated, deposited, and cured over the hole-transport layer 48. The Al-quinolinolate layer may alternatively include heat-sealing or pressure-sensitive adhesive oligomers. Similarly, the Al-quinolinolate component may also be mixed with vinyl or epoxy monomers for subsequent curing or cross-linking. The cathode layer 52 preferably consists of a film of aluminum, magnesium or calcium, either alone, in combination, or in alloys with zinc and/or silver (such as magnesium/silver, aluminum/zinc and aluminum/silver) deposited directly over the electron-acceptor layer 50. Finally, an ultra-high barrier coating is deposited to complete the composite package 10. Such a coating 54 may consist, for example, of polymer/inorganic/polymer layers. Typical polymers used for this purpose consist of acrylates; typical inorganic materials are aluminum, aluminum oxide and silicon oxide.

The main aspect of the invention lies in the recognition that the self-destructing propagation of the damage caused by a dielectric breakdown in the composite OLED's strata can be controlled by the judicious selection of the cathode and the dielectric materials and properties. The idea is to use a metallic electrode and electron-donor/electron-acceptor polymeric composites that will ensure the oxidation of the electrode exposed by a dielectric breakdown and the combustion of the elemental carbon produced by the current discharge that follows such dielectric failure. If these two conductive paths are eliminated, the electrical short is interrupted and the damage to the OLED structure is contained. Accordingly, the choice of cathode material and thickness is made based not only on producing an effective OLED performance but also on providing the thermodynamic properties required for a self-healing process.

It is noted that the only transparent material currently available that is suitable for OLED anode applications is ITO, which can withstand without damage the high current discharges associated with typical dielectric failures. Accordingly, the self-healing properties required for the invention are described only with reference to the cathode in the OLED structure, but it is understood that the same principles could be implemented through the anode, or through both electrodes.

In order for self-healing to occur, the cathode must melt and become oxidized by the high current produced by an electrical short, and the carbon released by the breakdown of the dielectric material must be eliminated through reaction with oxygen, hydrogen or nitrogen. Accordingly, the surface resistance of the cathode must be sufficiently high to limit the current in the arc to only what is required to generate enough heat to melt the cathode and allow the oxidation of its exposed surface. Low resistance can lead to excessive arc currents that increase the level of damage and minimize the probability of the self-healing event. The dielectric layers must contain sufficient oxygen to support the oxidation reaction and thereby create an insulating oxide layer on the cathode. In addition, the dielectric material must contain sufficient oxygen, hydrogen and nitrogen atoms (or other suitable elements) to bind the free carbon produced by the high current flow.

We found that aluminum, magnesium, calcium and various alloys and/or multilayer combinations of these materials alone or with other metals (e.g., Al/Zn, Al/Mg and Al/Ag) can be used to form a self-healing cathode. As a critical element of the invention, the surface resistance of the cathode layer needs to be greater than about 2 ohm/sq, preferably greater than 10 ohm/sq, and optimally about 100 ohm/sq; otherwise, not enough heat is generated by an electrical short to sustain the self-healing process. We also found that the cathode should preferably have a thickness of less than about 250 Å, optimally less than 200 Å; otherwise, the localized melting required for oxidation is not reliably obtained. Within these parameters, the relationship between the surface resistance and the thickness of the metallic cathode will change depending on the specific material used. For example, one material may have a surface resistance of 10 ohm/sq in a 120 Å thickness while another has same surface resistance at a thickness of 200 Å. The thinner cathode will have better self-healing properties, and therefore will be preferred, because it will more readily melt and oxidize. In the actual device, the need to have high ohm/sq to help the self-healing process should be balanced with the need to have low surface resistance to minimize the device's operating voltage and power losses. The chemistry of the polymerized monomer binder used to produce the electron- and hole-transport dielectric matrices is another important variable to effect self-healing. For a given polymeric dielectric/electrode system operating at a given voltage, this property is to a large extent a function of the O:C and H:C ratios and the degree of aromaticity in the polymer molecule. During a breakdown of the dielectric, the arc temperature causes the polymer to burn, which can lead to the self-healing event if the resulting carbon, which acts as a destructive conductor, is instead removed by the formation of $CO$, $CO_2$, $CH_3$, $CH_4$, and/or other hydrocarbon gases (in addition to the formation of nonconductive electrode oxides, such as $Al_2O_3$). Therefore, the chemistry of the polymer matrix material, or binder material, needs to be chosen not only to be compatible (that is, not causing charge trapping) with the active OLED molecules (hole-transport and electron-transport molecules), but also to aid the self-healing process. We found that this is accomplished by molecular structures that have either an O:C ratio of at least 0.1, larger numbers such as 0.35 being very preferable, or an H:C ratio of at least 0.10, numbers in the 1.11–1.12 range being very preferable. As one skilled in the art would appreciate, it is not possible to quantify an acceptable range for each ratio exactly because the self-healing properties of the invention depend on the combination of many factors, including electrode resistivity, polymer chemistry, interlayer pressure, applied voltage, melting point of the electrodes, composition of the photonic materials, and the nature of the packaging materials. Thus, these parameters need be selected in combination so as to produce the desired melting and oxidation effects on the metallic electrode and reaction with free carbon. The self-healing characteristics of a given combination will vary on a continuum as each parameter is changed. Therefore, the desired self-healing properties for a given OLED (e.g., a structure operating at a given voltage with an anode of predetermined surface resistance and thickness) are obtained by manipulating the O:C and/or the H:C ratios to ensure that sufficient oxidation and carbon gasification are produced during an electrical short. The table below illustrates these parameters for a number of monomer binders.

| Monomer | O:C Ratio | H:C Ratio | V/$\mu$m |
|---|---|---|---|
| Bisphenol-A-diacrylate | 0.25 | 0.08 | 300 |
| Ethoxylated bisphenol-A-diacrylate | 0.36 | 0.10 | 420 |
| Hexanediol diacrylate | 0.44 | 0.12 | 500 |

| Monomer | O:C Ratio | H:C Ratio | V/μm |
|---|---|---|---|
| Tripropylene glycol diacrylate | 0.53 | 0.13 | 720 |
| Triethylene glycol diacrylate | 0.66 | 0.12 | 850 |

Figure 2:
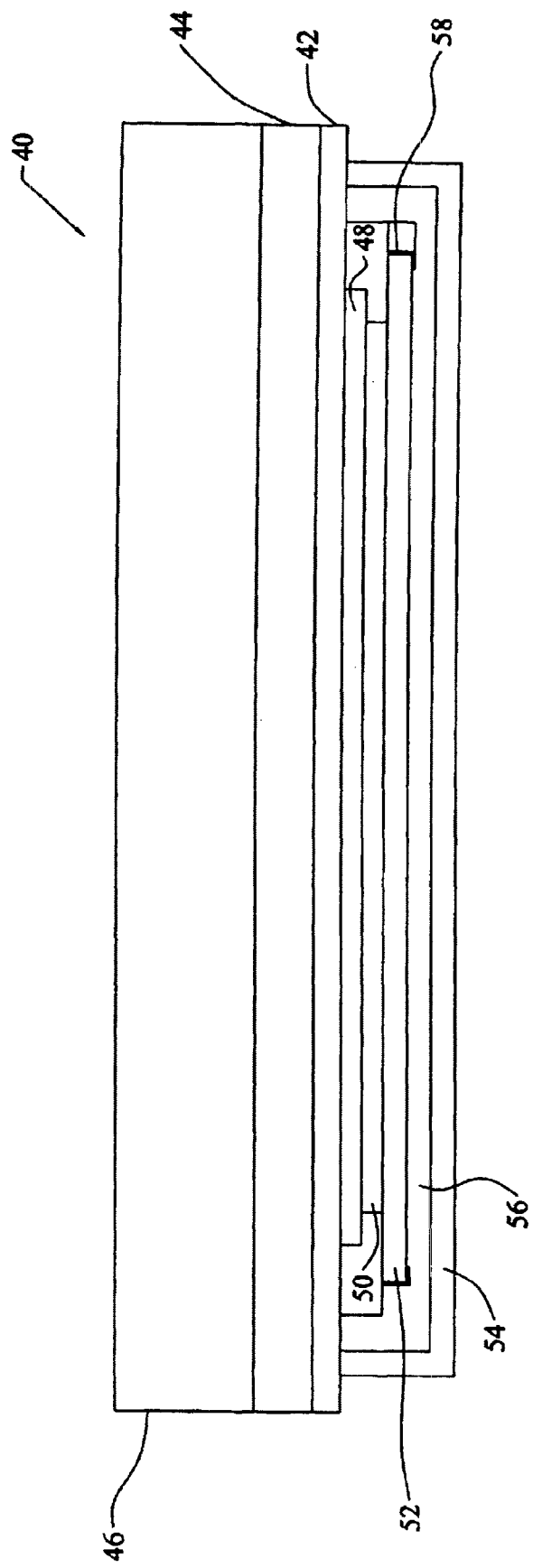
FIG. 2 is a schematic cross-sectional representations of a multi-layer OLED device.

Increasing voltages were applied to these monomers in a device configuration equivalent to the one illustrated in FIG. 2 in order to find the maximum electric field, V/μm, at which the device would no longer self-heal and, therefore, completely fail. Samples were made from two metal electrodes with the same surface resistance (about 2–5 ohm/sq) and one-half micron thick dielectric layer. The oxygen/carbon and hydrogen/carbon ratios were increased between samples. All tested samples started to short and self-heal at about 5–10% of the maximum field reported in the table. The maximum field is defined as the electric field at which the dielectric material undergoes continuous breakdown and clearing which lead to complete damage for the device structure. The table illustrates the fact that this breakdown field increases with both O:C and H:C ratios, as expected. Moreover, the fact that ethoxylated bisphenol-A-diacrylate produced results comparable to other monomers with similar ratios supports the validity of the concept of the invention for attaining a self-healing behavior.

Figure 3:
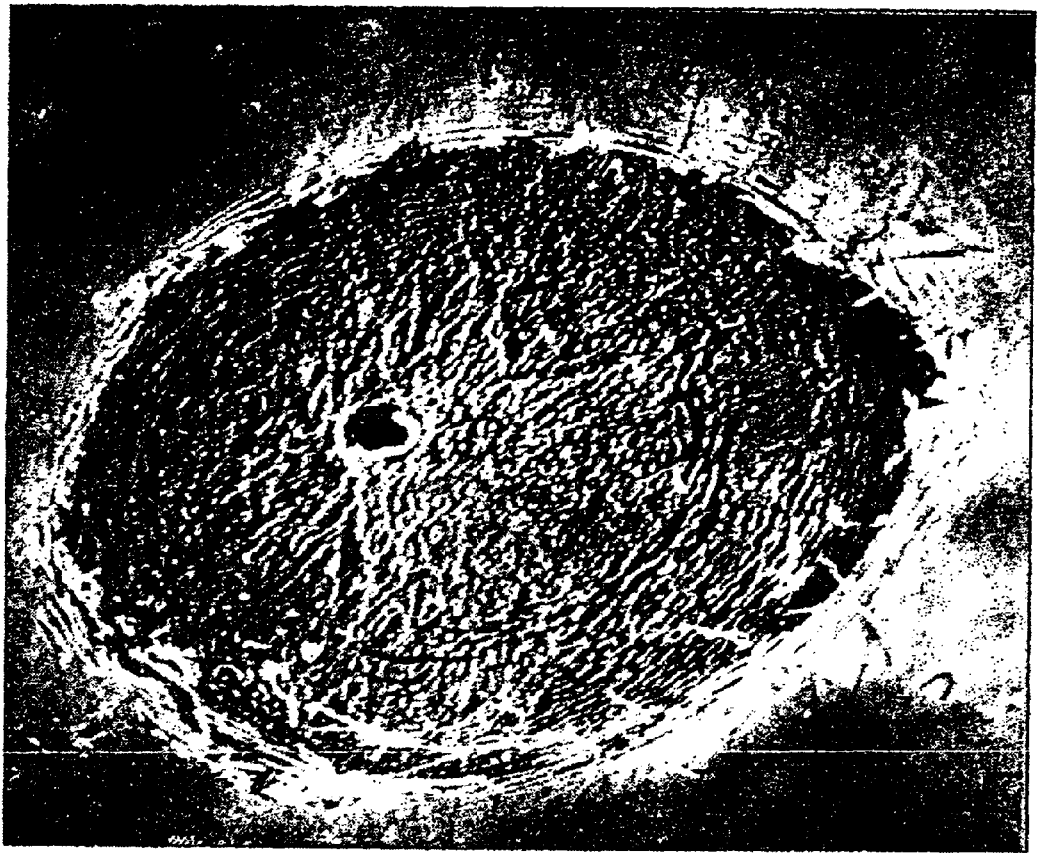
FIG. 3 is a scanning-electron photomicrograph of a self-healing event according to the invention, showing a breakdown in the polymer dielectric and a melt-back of the electrode causing the breakdown arc to become extinguished.

As a result of the design criteria of the invention, when a puncture develops in the polymeric dielectric layer or layers, the thin metallic electrode in the vicinity of the failure site is rapidly melted (or even vaporized). The melt-back and oxidation of the exposed portions of the electrode and the gasification of the free-carbon particles formed from the dielectric material restore the complete isolation between electrodes and cause the arc to become extinguished. Thus, the process prevents the arc from leading to large-scale damage and to the eventual breakdown of the whole OLED device. FIG. 3 illustrates the result of a self-healing event as seen through a scanning-electron photomicrograph. The puncture is clearly shown in the approximate center, and the demetallized region is seen around the puncture. Depending on operating conditions and material parameters, the clearing process removes an electrode area that is relatively very small (for example, a square mm) compared to the entire surface of the device.

Thus, in general the process of the invention involves the steps of preparing an appropriate formulation (either homogeneous or heterogeneous) containing an electron- or a hole-transport material and a curable monomer or oligomer in proportions suitable for the formation of a solid resin matrix incorporating the organic photonic ingredient and having self-healing properties according to the invention. Preferably, we found that 50–90% w/w photonic material and correspondingly 50–10% w/w monomer or oligomer (with an additional 1–3% w/w suitable catalysts and initiators) provide useful blends to practice the invention. As mentioned, such mixtures are typically liquid suspensions at room temperature (they may be semi-solid or solid mixtures when heavier monomers and oligomers are used). The blend is injected (or, if solid, extruded) through a nozzle into a hot evaporator at about 300–800° F. (about 150° C.–430° C.) under vacuum ($10^{-1}$–$10^{-7}$ torr). As one skilled in the art would readily understand, preferred temperature and vacuum pressure are selected based on the vapor pressure and the degradation temperature of the particular material being used. The blend is flash evaporated and then condensed onto a flexible moving web that is in good contact with a temperature-controlled rotating drum (at about −20° C. to 30° C.). The condensed film is then quickly cured (crosslinked) with high-energy ultraviolet or electron-beam radiation to produce a uniform solid film. The time gap between condensation and crosslinking must be very small (in the order of one microsecond to 10 seconds, preferably less than 10 milliseconds) to avoid any possible crystallization or phase separation. Typical irradiating conditions are 200–400 W/inch for UV treatment, and 5–20 KV with 5–200 mA currents for electron-beam radiation.

The following examples illustrate the invention. Except as noted, common operating conditions and materials were used for all examples.

EXAMPLE 1

A roll of optical-grade PET film (5–7 mil thick) coated with a clear conductive ITO layer was used as a substrate for a multilayer flexible light source according to the invention. The ITO layer was intended to be the anode in the final device. The electron-donor material N,N'-Bis(3-methylphenyl)-N,N'-diphenylbenzidine (TPD) was blended with ethoxylated bisphenol-A-diacrylate monomer in a 75/25% w/w ratio. An additional 2% w/w (of the total resulting blend) of the photoinitiator Irgacure® 184 (from Ciba Specialty Chemicals Additives in Terrytown, N.Y.) was added to the blend. The final blend was extruded into a preheated (about 300° F., 150° C.) vacuum evaporator (at about $3\times10^{-4}$ torr), flash evaporated, and deposited onto the ITO coated web substrate. Immediately after condensation (preferably within about 100 milliseconds), the condensed layer was irradiated with an electron beam (EB) for curing and crosslinking (alternatively, UV radiation could be used with equivalent results). The resulting cured film constituted the hole-transport layer (about 60 nm thick) of the OLED structure.

The electron-acceptor material, aluminum quinolinolate (Alq), was similarly mixed in a 75/25% w/w ratio with the same diacrylate monomer and an additional 2% w/w (of the total resulting blend) of Irgacure® 184 was added. The new blend was extruded into a second preheated (at about 300° F., 150° C.) vacuum evaporator (at about $3\times10^{-4}$ torr), flash evaporated, and deposited onto the top of the cured hole transporting layer. The condensed layer was immediately irradiated with EB or UV radiation for curing and crosslinking (again, preferably within about 100 milliseconds of deposit). The cured film constituted the electron-transport layer (about 60 nm thick) of the OLED device.

As cathode material, a layer of aluminum was evaporated from the inorganic evaporation station and deposited on top of the cured electron-transport layer. Finally, a three-layer barrier film composed of an acrylate/metal-oxide/acrylate sequence was deposited on top of the cathode and current collector. This barrier was designed to protect the device from moisture, oxygen and vapors.

EXAMPLE 2

The same as Example 1, but TPD was blended in a 90/10% w/w ratio with ethoxylated bisphenol-A-diacrylate monomer; and Alq was similarly mixed in a 90/10% w/w ratio with the same diacrylate monomer.

EXAMPLE 3

The same as Example 1, but TPD was blended in a 50/50% w/w ratio with ethoxylated bisphenol-A-diacrylate monomer; and Alq was similarly mixed in a 50/50% w/w ratio with the same diacrylate monomer.

In alternative runs, magnesium/silver, aluminum/silver, aluminum/magnesium, calcium, and silver were used as the cathode layer. In some cases, an aluminum layer was deposited on top of the cathode as an additional current-collector metal layer. Also, as alternative monomers to the diacrylate, methacrylates, cycloaliphatic epoxies, vinylethers, and mixtures thereof were successfully used.

EXAMPLE 4

The same as Examples 1–3, but hydrocarbon oligomers (bicycloaliphatic, polystyrenes and polyethylenes) where used instead of the acrylate monomer.

EXAMPLE 5

The same as Examples 1–3, but cationically polymerizable monomers (vinyl carbazole, cycloaliphatic di-epoxy, and vinyl ether) where used instead of the acrylate monomer.

The OLED composites resulting from all these examples were tested for performance by conventional energy-efficiency tests, spectral-measurements tests, and environmental tests (such as oxygen and moisture permeability).

It is understood that the preheating step can be carried out equivalently at temperatures in the range of about 300–800° F. (150° C.–430° C.); similarly the flash evaporation step is typically carried out at pressures in the range of $10^{-1}$–$10^{-6}$ torr. These are normal conditions for prior-art flash evaporation.

These examples demonstrate the feasibility of manufacturing flexible, large-area, light sources by multi-layer vapor deposition of blends of organic photonic molecules (hole-transport and electron-transport) with radiation-curable monomers and oligomers. The disclosed process possesses the advantages of being solvent-free, environmentally safe, and deposited at a high rate. Thus, large areas of product (up to hundreds of square feet) can be produced at low cost on a flexible web substrate. The resulting products are in the form of highly uniform, homogeneous, defect-free, and flexible OLEDs that can be used as light sources. Moreover, the continuous deposition process makes it possible to provide in-line metallization and packaging tailored to the needs of each specific application. Finally, and most importantly, the process of the invention yields an OLED product with much improved durability as a result of its self-healing characteristics.

It is noted that so long as the photonic substance is capable of vaporization without degradation under the operating conditions of a vacuum deposition chamber, any such OLED component can be processed according to the invention in a manner equivalent to the method and examples illustrated above.

Various changes in the details, steps and components that have been described may be made by those skilled in the art within the principles and scope of the invention herein illustrated and defined in the appended claims. For example, the order of deposition of the OLED layers could be changed to suit particular applications. Thus, the electron-donor and the electron-acceptor dielectric layers could be deposited separately on the anode and cathode, respectively, and then joined and packaged to form the OLED structure. This would be particularly attractive if one of the binders included a thermoplastic sealable oligomer, such as a bicycloaliphatic oligomer, which could then be used to seal the two components together.

Therefore, while the present invention has been shown and described herein in what is believed to be the most practical and preferred embodiments, it is recognized that departures can be made therefrom within the scope of the invention, which is not to be limited to the details disclosed herein but is to be accorded the full scope of the claims so as to embrace any and all equivalent processes and products.

We claim:

1. A process for manufacturing an organic light-emitting diode, comprising the following steps:
   (a) mixing a photonic material with a curable monomer composition in the absence of a solvent to produce a blend;
   (b) evaporating the blend in a vapor deposition unit to produce a vapor;
   (c) condensing the vapor onto a first electrode layer;
   (d) curing the monomer composition in the blend to produce a solid photonic layer; and
   (e) placing a second electrode layer over said solid photonic layer;
   wherein one of said first and second electrode layers has a surface resistance of at least 2 ohm/sq; and
   wherein said condensing step is conducted over a continuous substrate passing through the vapor deposition unit.

2. The process of claim 1, wherein said one of said first and second electrode layers has a thickness less than 250 Å.

3. The process of claim 1, wherein said first electrode layer comprises a flexible substrate.

4. The process of claim 1, wherein said evaporating step includes flash evaporation.

5. The process of claim 1, wherein said evaporating step is carried out at a pressure of about $10^{-1}$ to $10^{-7}$ torr.

6. The process of claim 1, wherein said evaporating step is carried out at a temperature of about 150° C.–430° C.

7. The process of claim 1, wherein said condensing step is carried out at a temperature of about −20° C. to 30° C.

8. The process of claim 1, wherein said curing step is carried out within 10 seconds after completion of the condensing step.

9. The process of claim 1, further including the step of depositing a protective layer over said second electrode layer.

10. The process of claim 1, wherein said one of said first and second electrode layers has a surface resistance between 10 and 100 ohm/sq and a thickness less than 200 Å.

11. The process of claim 1, wherein said monomer is selected from the group consisting of acrylates, methacrylates, cycloaliphatic epoxies, vinylethers, bicycloaliphatics, polystyrenes, polyethylenes, vinyl carbazoles, and mixtures thereof.

12. The process of claim 1, wherein said steps (b) through (e) are carried out in a single vapor deposition unit.

13. The process of claim 1, wherein said one of said first and second electrode layers comprises a material selected from the group consisting of aluminum, magnesium, calcium, zinc, silver, and mixtures thereof.

14. A self-healing organic light-emitting diode manufactured according to the process of claim 1.

15. A process for manufacturing an organic light-emitting diode, comprising the following steps:
   (a) mixing a first photonic material with a curable, first monomer composition in the absence of solvent to produce a first blend;
   (b) evaporating the first blend in a vapor deposition unit to produce a first vapor;
   (c) condensing the first vapor as a first film onto a first electrode layer;
   (d) curing the first film to produce a first solid photonic layer;

(e) mixing a second photonic material with a curable, second monomer composition in the absence of solvent to produce a second blend;

(f) evaporating the second blend in a vapor deposition unit to produce a second vapor;

(g) condensing the second vapor as a second film onto said first solid photonic layer;

(h) curing the second film to produce a second solid photonic layer; and (i) placing a second electrode layer over said second solid photonic layer;

wherein one of said first and second electrode layers has a surface resistance of at least 2 ohm/sq; and wherein said steps (b) through (d) and (f) through (i) are carried out in a single vapor deposition unit.

16. The process of claim 15, wherein said one of said first and second electrode layers has a thickness less than 250 Å.

17. The process of claim 15, wherein said first electrode layer comprises a flexible substrate.

18. The process of claim 15, wherein said evaporating steps include flash evaporation.

19. The process of claim 15, wherein said evaporating steps are carried out at a pressure of about $10^{-1}$ to $10^{-7}$ torr.

20. The process of claim 15, wherein said evaporating steps are carried out at a temperature of about 150° C.–430° C.

21. The process of claim 15, wherein said condensing steps are carried out at a temperature of about −20° C. to 30° C.

22. The process of claim 15, wherein said curing steps are carried out within 10 seconds after completion of the corresponding condensing step.

23. The process of claim 15, further including the step of depositing a protective layer over said second electrode layer.

24. The process of claim 15, wherein said one of said first and second electrode layers has a surface resistance between 10 and 100 ohm/sq and a thickness less than 200 Å.

25. The process of claim 15, wherein said one of said first and second electrode layers comprises a material selected from the group consisting of aluminum, magnesium, calcium, zinc, silver, and mixtures thereof.

26. The process of claim 15, wherein said first photonic material is an electron-donor material, said second photonic material is an electron-acceptor material, and said second electrode layer has a surface resistance between 10 and 100 ohm/sq and a thickness less than 200 Å.

27. The process of claim 15, wherein said first and second monomers are selected from the group consisting of acrylates, methacrylates, cycloalyphatic epoxies, vinylethers, bicycloalyphatics, polystyrenes, polyethylenes, vinyl carbazoles, and mixtures thereof.

28. A self-healing organic light-emitting diode manufactured according to the process of claim 15.

29. A process for manufacturing an organic light-emitting diode, comprising the following steps:

(a) mixing an electron-donor material with a curable, first monomer composition in the absence of solvent to produce a first blend;

(b) evaporating the first blend in a vapor deposition unit to produce a first vapor;

(c) condensing the first vapor as a first film onto an anode layer;

(d) curing the first film to produce a solid electron-donor layer;

(e) mixing an electron-acceptor material with a curable, second monomer composition in the absence of solvent to produce a second blend;

(f) evaporating the second blend in a vapor deposition unit to produce a second vapor;

(g) condensing the second vapor as a second film onto a cathode layer;

(h) curing the second film to produce a solid electron-acceptor layer; and (i) joining said electron-donor and said electron-acceptor layers to form an organic light-emitting diode;

wherein said cathode layer has a surface resistance of at least 2 ohm/sq; and wherein said condensing steps are conducted over a continuous substrate.

30. The process of claim 29, wherein said first and second monomer compositions are selected from the group consisting of acrylates, methacrylates, cycloalyphatic epoxies, vinylethers, bicycloalyphatics, polystyrenes, polyethylenes, vinyl carbazoles, and mixtures thereof.

31. The process of claim 29, wherein said steps (b) through (d) and (f) through (h) are carried out in a single chamber.

32. The process of claim 29, wherein said cathode comprises a material selected from the group consisting of aluminum, magnesium, calcium, zinc, silver, and mixtures thereof.

33. A process for manufacturing an organic light-emitting diode, comprising the following steps:

(a) mixing a photonic material with a curable monomer composition in the absence of a solvent to produce a blend;

(b) evaporating the blend in a vapor deposition unit to produce a vapor;

(c) condensing the vapor onto a first electrode layer;

(d) curing the monomer composition in the blend to produce a solid photonic layer; and (e) placing a second electrode layer over said solid photonic layer;

wherein one of said first and second electrode layers has a surface resistance of at least 2 ohm/sq; and wherein said steps (b) through (e) are carried out in a single vapor deposition unit.

34. The process of claim 33, wherein said one of said first and second electrode layers has a thickness less than 250 Å.

35. The process of claim 33, wherein said first electrode layer comprises a flexible substrate.

36. The process of claim 33, further including the step of depositing a protective layer over said second electrode layer.

37. The process of claim 33, wherein said monomer is selected from the group consisting of acrylates, methacrylates, cycloalyphatic epoxies, vinylethers, bicycloalyphatics, polystyrenes, polyethylenes, vinyl carbazoles, and mixtures thereof.

38. The process of claim 33, wherein said one of said first and second electrode layers comprises a material selected from the group consisting of aluminum, magnesium, calcium, zinc, silver, and mixtures thereof.

39. A process for manufacturing an organic light-emitting diode, comprising the following steps:

(a) mixing a first photonic material with a curable, first monomer composition in the absence of solvent to produce a first blend;

(b) evaporating the first blend in a vapor deposition unit to produce a first vapor;

(c) condensing the first vapor as a first film onto a first electrode layer;

(d) curing the first film to produce a first solid photonic layer;

(e) mixing a second photonic material with a curable, second monomer composition in the absence of solvent to produce a second blend;

(f) evaporating the second blend in a vapor deposition unit to produce a second vapor;

(g) condensing the second vapor as a second film onto said first solid photonic layer;

(h) curing the second film to produce a second solid photonic layer; and (i) placing a second electrode layer over said second solid photonic layer;

wherein one of said first and second electrode layers has a surface resistance of at least 2 ohm/sq; and wherein said condensing steps are conducted over a continuous substrate.

40. The process of claim 39, wherein said one of said first and second electrode layers has a thickness less than 250 Å.

41. The process of claim 39, wherein said first electrode layer comprises a flexible substrate.

42. The process of claim 39, further including the step of depositing a protective layer over said second electrode layer.

43. The process of claims, wherein said monomer is selected from the group consisting of acrylates, methacrylates, cycloalyphatic epoxies, vinylethers, bicycloalyphatics, polystyrenes, polyethylenes, vinyl carbazoles, and mixtures thereof.

44. The process of claims, wherein said one of said first and second electrode layers comprises a material selected from the group consisting of aluminum, magnesium, calcium, zinc, silver, and mixtures thereof.

45. A process for manufacturing an organic light-emitting diode, comprising the following steps:

(a) mixing an electron-donor material with a curable, first monomer composition in the absence of solvent to produce a first blend;

(b) evaporating the first blend in a vapor deposition unit to produce a first vapor;

(c) condensing the first vapor as a first film onto an anode layer;

(d) curing the first film to produce a solid electron-donor layer;

(e) mixing an electron-acceptor material with a curable, second monomer composition in the absence of solvent to produce a second blend;

(f) evaporating the second blend in a vapor deposition unit to produce a second vapor;

(g) condensing the second vapor as a second film onto a cathode layer;

(h) curing the second film to produce a solid electron-acceptor layer; and (i) joining said electron-donor and said electron-acceptor layers to form an organic light-emitting diode;

wherein said cathode layer has a surface resistance of at least 2 ohm/sq; and wherein said steps (b) through (d) and (f) through (h) are carried out in a single chamber.

46. The process of claim 45, wherein said first and second monomer compositions are selected from the group consisting of acrylates, methacrylates, cycloalyphatic epoxies, vinylethers, bicycloalyphatics, polystyrenes, polyethylenes, vinyl carbazoles, and mixtures thereof.

47. The process of claim 45, wherein said cathode comprises a material selected from the group consisting of aluminum, magnesium, calcium, zinc, silver, and mixtures thereof.

48. A process for manufacturing an organic light-emitting diode, comprising the following steps:

(a) mixing a photonic material with a curable monomer composition in the absence of a solvent to produce a blend;

(b) flash evaporating the blend in a vapor deposition unit to produce a vapor;

(c) condensing the vapor onto a first electrode layer;

(d) curing the monomer composition in the blend to produce a solid photonic layer; and (e) placing a second electrode layer over said solid photonic layer;

wherein one of said first and second electrode layers has a surface resistance of at least 2 ohm/sq, as required to cause said one of said first and second electrode layers to melt and become oxidized by reacting with said solid photonic layer when subjected to a current produced by an electrical short.

49. A self-healing organic light-emitting diode manufactured according to the process of claim 48.

50. A process for manufacturing an organic light-emitting diode, comprising the following steps:

(a) mixing a first photonic material with a curable, first monomer composition in the absence of solvent to produce a first blend;

(b) flash evaporating the first blend in a vapor deposition unit to produce a first vapor;

(c) condensing the first vapor as a first film onto a first electrode layer;

(d) curing the first film to produce a first solid photonic layer;

(e) mixing a second photonic material with a curable, second monomer composition in the absence of solvent to produce a second blend;

(f) flash evaporating the second blend in a vapor deposition unit to produce a second vapor;

(g) condensing the second vapor as a second film onto said first solid photonic layer;

(h) curing the second film to produce a second solid photonic layer; and (i) placing a second electrode layer over said second solid photonic layer;

wherein one of said first and second electrode layers has a surface resistance of at least 2 ohm/sq, as required to cause said one of said first and second electrode layers to melt and become oxidized by reacting with a corresponding solid photonic layer when subjected to a current produced by an electrical short.

51. A self-healing organic light-emitting diode manufactured according to the process of claim 50.

52. A process for manufacturing an organic light-emitting diode, comprising the following steps:

(a) mixing an electron-donor material with a curable, first monomer composition in the absence of solvent to produce a first blend;

(b) flash evaporating the first blend in a vapor deposition unit to produce a first vapor;

(c) condensing the first vapor as a first film onto an anode layer;

(d) curing the first film to produce a solid electron-donor layer;

(e) mixing an electron-acceptor material with a curable, second monomer composition in the absence of solvent to produce a second blend;

(f) flash evaporating the second blend in a vapor deposition unit to produce a second vapor;

(g) condensing the second vapor as a second film onto a cathode layer;

(h) curing the second film to produce a solid electron-acceptor layer; and (i) joining said electron-donor and said electron-acceptor layers to form an organic light-emitting diode;

wherein said cathode layer has a surface resistance of at least 2 ohm/sq, as required to cause said cathode layer to melt and become oxidized by reacting with said solid electron-acceptor layer when subjected to a current produced by an electrical short.

53. A self-healing organic light-emitting diode manufactured according to the process of claim 52.

* * * * *

UNITED STATES PATENT AND TRADEMARK OFFICE
CERTIFICATE OF CORRECTION

PATENT NO. : 6,649,433 B2
DATED : November 18, 2003
INVENTOR(S) : Michael G. Mikhael and Angelo Yializis It is certified that error appears in the above-identified patent and that said Letters Patent is hereby corrected as shown below:

Column 13,
Lines 28 and 33, "claims" should read -- claim 39 --.

Signed and Sealed this

Sixth Day of April, 2004

JON W. DUDAS
*Acting Director of the United States Patent and Trademark Office*